(12) United States Patent
Zhu et al.

(10) Patent No.: US 9,419,659 B2
(45) Date of Patent: Aug. 16, 2016

(54) SIGNAL RECEIVER, RELATED METHOD, AND RELATED ELECTRONIC DEVICE

(71) Applicant: Semiconductor Manufacturing International (Shanghai) Corporation, Shanghai (CN)

(72) Inventors: Kai Zhu, Shanghai (CN); Jie Chen, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/837,484

(22) Filed: Aug. 27, 2015

(65) Prior Publication Data

US 2016/0112077 A1     Apr. 21, 2016

(30) Foreign Application Priority Data

Oct. 17, 2014  (CN) .......................... 2014 1 0554629

(51) Int. Cl.
*H03D 1/04* (2006.01)
*H04B 1/10* (2006.01)
*H03F 3/193* (2006.01)

(52) U.S. Cl.
CPC ................. *H04B 1/10* (2013.01); *H03F 3/193* (2013.01); *H03F 2200/451* (2013.01)

(58) Field of Classification Search
CPC .......... H04B 1/109; H04B 1/12; H03F 3/189; H03F 3/193
USPC ............ 375/316, 318, 319, 345, 346; 327/50, 327/58, 62, 74; 330/301, 302, 304
See application file for complete search history.

(56) References Cited

U.S. PATENT DOCUMENTS

| | | | | |
|---|---|---|---|---|
| 6,529,355 | B1 * | 3/2003 | Becker .................... | H02H 9/025 361/101 |
| 2002/0000876 | A1 * | 1/2002 | Kawai ...................... | H04L 27/14 329/301 |
| 2005/0046448 | A1 * | 3/2005 | Ha ............................ | H03F 3/08 327/103 |
| 2007/0115227 | A1 * | 5/2007 | Nishida ................... | H01S 5/042 345/82 |
| 2008/0297093 | A1 * | 12/2008 | Wimmer ................ | G11B 5/486 318/597 |
| 2014/0240045 | A1 * | 8/2014 | Moreira .............. | H03F 3/45071 330/261 |

* cited by examiner

*Primary Examiner* — Khanh C Tran
(74) *Attorney, Agent, or Firm* — Innovation Counsel LLP

(57) ABSTRACT

A signal receiver may include a limiter and an amplifier that is connected to the limiter. The limiter may receive an input signal, generate a limited signal using the input signal, limit values of the limited signal in a first range, and output the limited signal. The amplifier may receive the limited signal, generate an output signal using the limited signal, and output the output signal, wherein values of the output signal are in a second range, and wherein the second range is larger than or equal to the first range.

19 Claims, 4 Drawing Sheets

SIGNAL RECEIVER, RELATED METHOD, AND RELATED ELECTRONIC DEVICE

CROSS-REFERENCE TO RELATED APPLICATION

This application claims priority to and benefit of Chinese Patent Application No. 201410554629.0, filed on 17 Oct. 2014; the Chinese Patent Application is incorporated herein by reference in its entirety.

BACKGROUND OF THE INVENTION

The present invention is related to a signal receiver, a method of operating the signal receiver, and an electronic device that includes the signal receiver.

A signal receiver may be included in an electronic device for receiving digital or analog input signals from an external source and for outputting output signals to another component of the electronic device. If the upper limit and lower limit of the input signals are asymmetrical with respect to a middle level, the output signals of the signal receiver may be substantially imbalanced in high frequency operation. As a result, the performance of the electronic device may be substantially unsatisfactory.

SUMMARY

An embodiment of the present invention may be related to a signal receiver. The signal receiver may include a limiter and an amplifier. The limiter may be configured to receive an input signal, configured to generate a limited signal using the input signal, configured to limit values of the limited signal in a first range, and configured to output the limited signal. The first range may be defined by a first limit value (e.g., a voltage value) and a second limit value (e.g., a voltage value). The first limit value may be less than the second limit value. The amplifier may be configured to receive the limited signal, configured to generate an output signal using the limited signal, and configured to output the output signal. Values of the output signal may be in a second range. The second range may be larger than or equal to the first range.

The limiter may include a first transistor, which may be configured to generate a clamped signal using the input signal. The limiter may further include a second transistor, which may be configured to generate the limited signal using the clamped signal. The first transistor and the second transistor may be electrically connected in a series connection. Values of the clamped signal may be greater than or equal to the first limit value or may be less than or equal to the second limit value.

A gate terminal of the first transistor may receive a first bias signal. A value (e.g., a voltage value) of the first bias signal may depend on the first limit value or the second limit value.

A body terminal of the first transistor may receive a first body terminal signal. A value (e.g., a voltage value) of the first body terminal signal may be greater than the second limit value. The first body terminal signal may be a power supply voltage.

A body terminal of the second transistor may receive a second body terminal signal. A value (e.g., a voltage value) of the second body terminal signal may be less than the first limit value. The second body terminal signal may be a reference voltage (or ground voltage).

The second range may be defined by the value of the second body terminal signal (as the lower limit value) and the value of the first body terminal signal (as the higher limit value).

The first transistor may be a P-channel transistor. The value of the first bias signal may be substantially equal to the first limit value minus a gate threshold value of the first transistor. The values of the clamped signal may be greater than or equal to the first limit value.

A gate terminal of the second transistor may receive a second bias signal. A value (e.g., a voltage value) of the second bias signal may depend on the second limit value.

The second transistor may be an N-channel transistor. The value of the second bias signal may be substantially equal to the second limit value plus a gate threshold value of the second transistor.

The first transistor may be an N-channel transistor. The value of the first bias signal may be substantially equal to the second limit value plus a gate threshold value of the first transistor. The values of the clamped signal may be less than or equal to the second limit value.

The second transistor may be a P-channel transistor. A gate terminal of the second transistor may receive a second bias signal. A value of the second bias signal may depend on the first limit value.

The value of the second bias signal may be substantially equal to the first limit value minus a gate threshold value of the second transistor.

The amplifier may include a first inverter and a second inverter. The limiter may include a P-channel transistor and an N-channel transistor. The P-channel transistor, the N-channel transistor, the first inverter, and the second inverter may be electrically connected in series.

An embodiment of the present invention may be related to a method of operating a signal receiver. The method may include generating a clamped signal using both a first transistor of the signal receiver and an input signal. Values of the clamped signal may be greater than or equal to a first limit value or may be less than or equal to a second limit value. The first limit value may be less than the second limit value. The method may further include generating a limited signal using both a second transistor of the signal receiver and the clamped signal. The first transistor and the second transistor may be electrically connected in series. Values of the limited signal may be in a first range. The first range may be defined by the first limit value and the second limit value. The method may include generating an output signal using both an amplifier of the signal receiver and the limited signal. Values of the output signal may be in a second range. The second range may be larger than or equal to the first range.

The method may include the following steps: determining a value of a first bias signal using the first limit value or the second limit value; and providing the first bias signal to a gate terminal of the first transistor.

The first transistor may be a P-channel transistor. The value of the first bias signal may be substantially equal to the first limit value minus a gate threshold value of the first transistor. The values of the clamped signal may be greater than or equal to the first limit value.

The method may include the following steps: determining a value of a second bias signal using the second limit value; and providing the second bias signal to a gate terminal of the second transistor.

The method may include the following steps: providing a first body terminal signal to a body terminal of the first transistor; and providing a second body terminal signal to a body terminal of the second transistor. A value of the first body terminal signal may be greater than the second limit value. A value of the second body terminal signal may be less than the first limit value. The second range may be defined by the value of the second body terminal signal and the value of the first body terminal signal.

The first transistor may be an N-channel transistor. The values of the clamped signal may be less than or equal to the second limit value. The value of the first bias signal may be substantially equal to the second limit value plus a gate threshold value of the first transistor.

The method may include predetermining a frequency limit value. The method may include limiting the frequency of the input signal to be less than or equal to the predetermined frequency limit value, such that satisfactory performance of the signal receiver may be ensured.

An embodiment of the present invention may be related to an electronic device. The electronic device may include an electronic component and a signal receiver. The signal receiver may be electrically connected to the electronic component and may provide output signals to the electronic component. The signal receiver may have one or more of the aforementioned features.

According to embodiments of the present invention, even if input signals are not rail-to-rail or at a middle level, output signals provided by a signal receiver may be substantially rail-to-rail and/or may be substantially balanced. Advantageously, performance of one or more electronic components that utilize the output signals may be substantially satisfactory, and/or performance of an electronic device that includes the signal receiver may be substantially satisfactory. According to embodiments of the present invention, the structure of the signal receiver may be substantially simple. Advantageously, cost associated with implementing the signal receiver may be satisfactorily low.

The above summary is related to some of many embodiments of the invention disclosed herein and is not intended to limit the scope of the invention.

DETAILED DESCRIPTION

Figure 1:
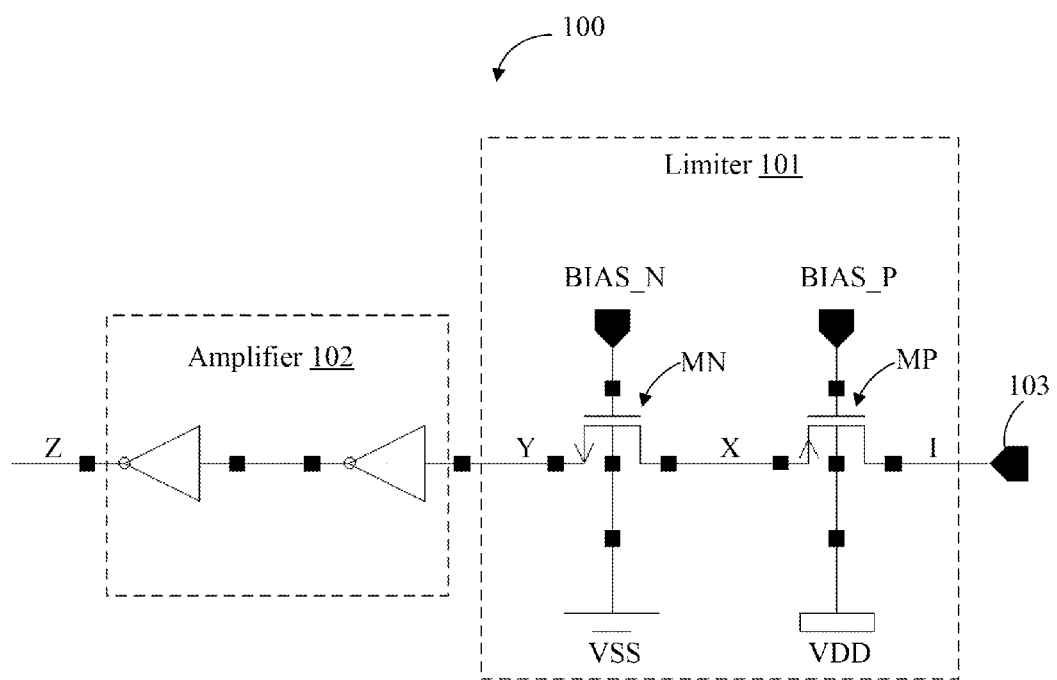
FIG. 1 shows a schematic diagram (e.g., a schematic circuit diagram) that illustrates elements and/or structures in a signal receiver in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "below," "lower," "under," "above," "upper" and the like, may be used herein for ease of description to describe the relationship of one element or feature to another element(s) or feature(s) as illustrated in the figures. The spatially relative terms may encompass different orientations of a device or structure in use or operation, in addition to the orientation(s) illustrated in the figures. For example, if a device or structure illustrated in a figure is turned over, elements described as "below" or "beneath" relative to other elements would then be positioned "above" relative to the other elements or features. Thus, the term "below" can encompass both a position of above and below. A device or structure may be otherwise oriented (e.g., rotated by 90 degrees or oriented at other orientations), and the spatially relative descriptors should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 2:
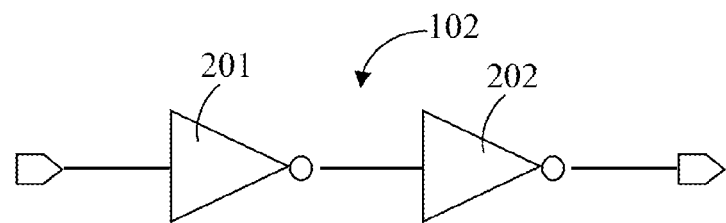
FIG. 2 shows a schematic diagram (e.g., a schematic circuit diagram) that illustrates elements and/or structures in an amplifier in accordance with one or more embodiments of the present invention.
Figure 3:
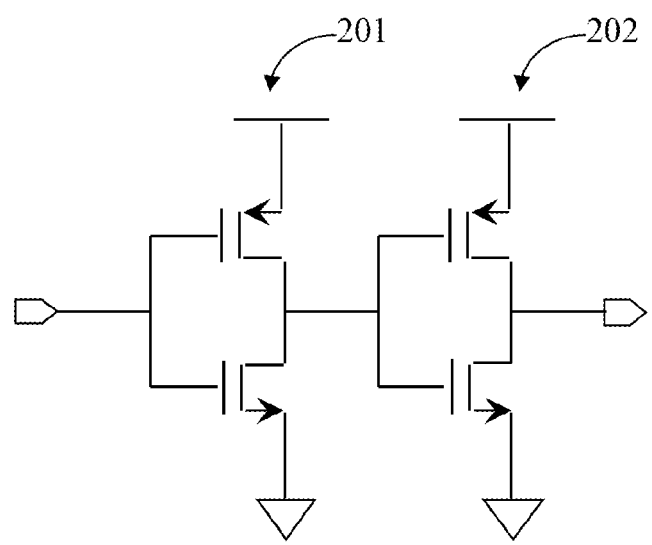
FIG. 3 shows a schematic diagram (e.g., a schematic circuit diagram) that illustrates elements and/or structures in an amplifier in accordance with one or more embodiments of the present invention.
Figure 4:
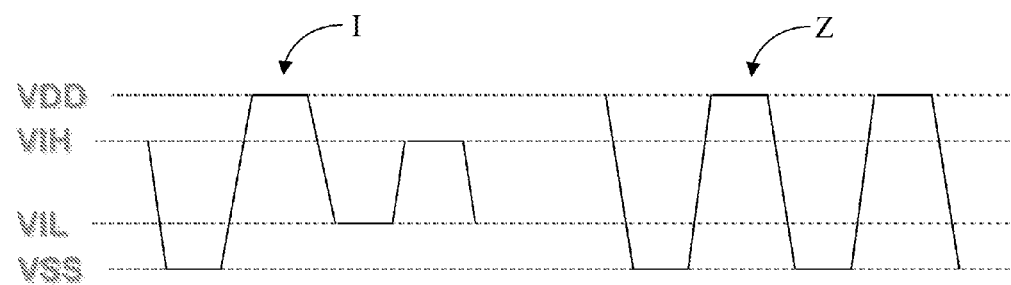
FIG. 4 shows a schematic diagram (e.g., a schematic waveform diagram) that illustrates an example of an input signal and an example of an output signal related to a method of operating a signal receiver in accordance with one or more embodiments of the present invention.

FIG. 1 shows a schematic diagram (e.g., a schematic circuit diagram) that illustrates elements and/or structures in a signal receiver 100 in accordance with one or more embodiments of the present invention. FIG. 2 shows a schematic diagram (e.g., a schematic circuit diagram) that illustrates elements and/or structures in an amplifier 102 of the signal receiver 100 in accordance with one or more embodiments of the present invention. FIG. 3 shows a schematic diagram (e.g., a schematic circuit diagram) that illustrates elements and/or structures in the amplifier 102 in accordance with one or more embodiments of the present invention. FIG. 4 shows a schematic diagram (e.g., a schematic waveform diagram) that illustrates an example of an input signal I and an example of an output signal Z related to a method of operating the signal receiver 100 in accordance with one or more embodiments of the present invention.

The signal receiver 100 may include a terminal 103 (e.g., a conductive pad), a limiter 101, and an amplifier 102. The terminal 103, the limiter 101, and the amplifier 102 may be electrically connected in series. The limiter 101 may be electrically connected between the terminal 103 and the amplifier 102.

The limiter 101 may receive an input signal I through the terminal 103, may generate a limited signal Y using the input signal I, may limit values of the limited signal Y in a first range, and may output the limited signal Y. The first range may be defined by a first limit value VIL and a second limit value VIH. The first limit value VIL may be less than the second limit value VIH. Examples of the limit values VIL and VIH are indicated in FIG. 4.

The amplifier 102 may receive the limited signal Y, may generate an output signal Z using the limited signal Y, and may output the output signal Z. Values of the output signal Z may be in a second range. The second range may be larger than or equal to the first range. The upper limit value VDD of the second range may be greater than or equal to the second limit value VIH. The lower limit value VSS of the second range may be less than or equal to the first limit value VIL. Examples of the limit values VSS and VDD are indicated in FIG. 4.

The limiter 101 may include a first transistor, which may generate a clamped signal X using the input signal I. The limiter 101 may further include a second transistor, which may generate the limited signal Y using the clamped signal X. The first transistor and the second transistor may be electrically connected in series. The first transistor may be electrically connected between the terminal 103 and the second transistor. Values of the clamped signal X may be greater than or equal to the first limit value VIL or may be less than or equal to the second limit value VIH.

A gate terminal of the first transistor may receive a first bias signal. A gate terminal of the second transistor may receive a second bias signal. Each of a value of the first bias signal and a value of the second bias signal may depend on the first limit value VIL or the second limit value VIH.

In an embodiment, referring to FIG. 1, the first transistor may be a P-channel (or P-type) transistor MP. The P-channel transistor MP may be a P-channel metal-oxide-semiconductor field-effect transistor (PMOS transistor). The gate terminal of the P-channel transistor MP may receive a first bias signal BIAS_P. The value of the first bias signal BIAS_P may be substantially equal to the first limit value VIL minus a gate threshold value (e.g., a threshold voltage value) of the P-channel transistor MP.

The P-channel transistor MP may be on (i.e., conductive) when a value of the input signal I minus the value of the first bias signal BIAS_P is greater than (or equal to) the gate threshold value of the P-channel transistor MP; the P-channel transistor MP may be off (i.e., not conductive) when a value of the input signal I minus the value of the first bias signal BIAS_P is less than (or equal to) the gate threshold value of the P-channel transistor MP. Given that the value of the first bias signal BIAS_P is substantially equal to the first limit value VIL minus a gate threshold value of the P-channel transistor MP, a portion of the input signal I having values greater than (or equal to) the first limit value VIL may be transmitted through the P-channel transistor MP; a portion of the input signal I having values less than (or equal to) the first limit value VIL may not be transmitted through the P-channel transistor MP. As a result, the values of the clamped signal X may be greater than (or equal to) the first limit value VIL.

The body terminal of the P-channel transistor MP may receive a first body terminal signal. A value of the first body terminal signal may be greater than the second limit value VIH. The first body terminal signal may be a power supply voltage for the signal receiver 100 and/or an electronic device that includes the signal receiver 100. The value of the first body terminal signal may be equal to the upper limit value VDD of the second range, within which values of the output signal Z may be limited. The upper limit value VDD may be a power supply voltage value.

In an embodiment, referring to FIG. 1, the second transistor may be an N-channel (or N-type) transistor MN. The N-channel transistor MN may be an N-channel metal-oxide-semiconductor field-effect transistor (NMOS transistor). The gate terminal of the N-channel transistor MN may receive a second bias signal BIAS_N. The value of the second bias signal BIAS_N may be substantially equal to the second limit value VIH plus a gate threshold value (e.g., a threshold voltage value) of the N-channel transistor MN.

The N-channel transistor MN may be on (i.e., conductive) when the value of the second bias signal BIAS_N minus a value of the clamped signal X (i.e., a value of a clamped portion of the input signal I) is greater than (or equal to) the gate threshold value of the N-channel transistor MN; the N-channel transistor MN may be off (i.e., not conductive) when the value of the second bias signal BIAS_N minus a value of the clamped signal X (i.e., a value of the clamped portion of the input signal I) is less than (or equal to) the gate threshold value of the P-channel transistor MP. Given that the value of the second bias signal BIAS_N is substantially equal to the second limit value VIH plus the gate threshold value of the N-channel transistor MN, a part of the clamped signal X (i.e., a part of the clamped portion of the input signal I) having values less than (or equal to) the second limit value VIH may be transmitted through the N-channel transistor MN; a part of the clamped signal X (i.e., a part of the clamped portion of the input signal I) having values larger than (or equal to) the second limit value VIH may not be transmitted through the N-channel transistor MN. As a result, the values of the limited signal Y may be less than (or equal to) the second limit value VIH.

The body terminal of the N-channel transistor MN may receive a second body terminal signal. A value of the second body terminal signal may be less than the first limit value VIL. The second body terminal signal may be a reference voltage (or ground voltage). The value of the second body terminal signal may be equal to the lower limit value VSS of the second range, within which values of the output signal Z may be limited. The lower limit value VSS may be a reference voltage value (or ground voltage value).

The second range, within which values of the output signal Z may be limited, may be defined by the value of the second body terminal signal to the value of the first body terminal signal.

In an embodiment, the first transistor may be an N-channel transistor, and the second transistor may be a P-channel transistor. The N-channel transistor may be electrically connected between the terminal 103 and the P-channel transistor. A gate terminal of the N-channel transistor may receive a first bias signal. The value of a first bias signal may be substantially equal to the second limit value VIH plus a gate threshold value of the N-channel transistor. The values of the clamped signal X provided by the N-channel transistor may be less than or equal to the second limit value VIH. A gate terminal of the P-channel transistor may receive a second bias signal. The value of the second bias signal may be substantially equal to the first limit value VIL minus a gate threshold value of the P-channel transistor. The values of the limited signal Y provided by the P-channel transistor may be greater than or equal to the first limit value VIL.

Referring to FIG. 1 and FIG. 2, the amplifier 102 may include a first inverter 201 and a second inverter 202, which may be electrically connected in series. Referring to FIG. 2 and FIG. 3, each of the first inverter 201 and the second inverter 202 may be a CMOS (complementary metal-oxide-semiconductor) inverter. The first transistor (e.g., a P-channel transistor or an N-channel transistor), the second transistor (e.g., an N-channel transistor or a P-channel transistor), the first inverter, and the second inverter may be electrically connected in series. The structure of the signal receiver may be substantially simple. Advantageously, cost associated with implementing the signal receiver may be satisfactorily low.

In an embodiment, referring to FIG. 1 and FIG. 2, the N-channel transistor may be electrically connected between the first inverter 201 and the P-channel transistor. In an embodiment, the P-channel transistor may be electrically connected between the first inverter 201 and the N-channel transistor.

The values of the output signal Z (i.e., an amplified signal) provided by the amplifier 102 may be limited in the second range. The second range may be defined by the limit values VSS and VDD.

Referring to FIG. 4, even if the input signal I received by the signal receiver 100 may not be rail-to-rail, the output signal Z provided by the signal receiver 100 may be substantially rail-to rail. Input signals I received by the signal receiver 100 may have various waveforms, and output signals Z provided by the signal receiver 100 may have a substantially consistent, substantially rail-to-rail waveform. Advantageously, performance of one or more electronic components that utilize the output signals Z may be substantially satisfactory, and/or performance of an electronic device that includes the signal receiver 100 may be substantially satisfactory.

A method of operating the signal receiver 100 may include determining one or more of the above-discussed values (.e.g., voltage values) of the first bias signal, the second bias signal, the first body terminal signal, and the second body terminal signal. The method may include one or more of the above-discussed steps of receiving an input signal I, generating a clamped signal X using the input signal I (e.g., by clamping the input signal I), generating a limited signal Y using the clamped signal X (e.g., by limiting the clamped signal X), and generating an output signal Z using the limited signal Y (e.g., by amplifying the limited signal Z).

In an embodiment, the method may include predetermining a frequency limit value. The method may include limiting the frequency of the input signal I to be less than or equal to the predetermined frequency limit value, such that satisfactory performance of the signal receiver 100 may be ensured.

Figure 5:
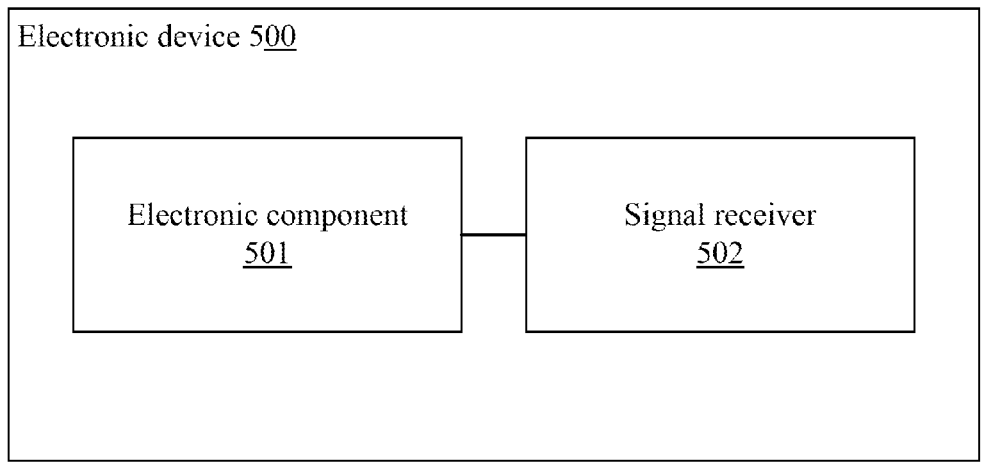
FIG. 5 shows a schematic block diagram that illustrates elements in an electronic device in accordance with one or more embodiments of the present invention.

FIG. 5 shows a schematic block diagram that illustrates elements in an electronic device 500 in accordance with one or more embodiments of the present invention. The electronic device 500 may include an electronic component 501 and a signal receiver 502 that is electrically connected to the electronic component 501. The signal receiver 502 may have one or more of the above-discussed features and may provide an output signal to the electronic component 501.

In an embodiment, the electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device may be or may include an intermediate product (e.g., a mobile phone main board) or module including a semiconductor device that may have one or more of the features and advantages discussed above.

According to embodiments of the present invention, even if input signals are not rail-to-rail or at a middle level, output signals provided by a signal receiver may be substantially rail-to-rail and/or may be substantially balanced. Advantageously, performance of one or more electronic components that utilize the output signals may be substantially satisfactory, and/or performance of an electronic device that includes the signal receiver may be substantially satisfactory. According to embodiments of the present invention, the structure of the signal receiver may be substantially simple. Advantageously, cost associated with implementing the signal receiver may be satisfactorily low.

While this invention has been described in terms of several embodiments, there are alterations, permutations, and equivalents, which fall within the scope of this invention. There are many alternative ways of implementing the methods and apparatuses of the present invention. Embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A signal receiver comprising:
   a limiter configured to receive an input signal, configured to generate a limited signal using the input signal, configured to limit values of the limited signal in a first range, and configured to output the limited signal, wherein the first range is defined by a first limit value and a second limit value, wherein the first limit value is less than the second limit value; and
   an amplifier configured to receive the limited signal, configured to generate an output signal using the limited signal, and configured to output the output signal, wherein values of the output signal are in a second range, and wherein the second range is larger than or equal to the first range,
   wherein the limiter comprises:
   a first transistor, which is configured to generate a clamped signal using the input signal; and
   a second transistor, which is configured to generate the limited signal using the clamped signal,
   wherein the first transistor and the second transistor are electrically connected to each other in series, and
   wherein values of the clamped signal is greater than or equal to the first limit value or is less than or equal to the second limit value.

2. The signal receiver of claim 1,
   wherein a gate terminal of the first transistor receives a first bias signal, and
   wherein a value of the first bias signal depends on the first limit value or the second limit value.

3. The signal receiver of claim 2,
   wherein a body terminal of the first transistor receives a first body terminal signal, and
   wherein a value of the first body terminal signal is greater than the second limit value.

4. The signal receiver of claim 3,
   wherein a body terminal of the second transistor receives a second body terminal signal, and
   wherein a value of the second body terminal signal is less than the first limit value.

5. The signal receiver of claim 4, wherein the second range is defined by the value of the second body terminal signal and the value of the first body terminal signal.

6. The signal receiver of claim 2,
   wherein the first transistor is a P-channel transistor,
   wherein the value of the first bias signal is substantially equal to the first limit value minus a gate threshold value of the first transistor, and
   wherein the values of the clamped signal are greater than or equal to the first limit value.

7. The signal receiver of claim 6,
   wherein a gate terminal of the second transistor receives a second bias signal, and
   wherein a value of the second bias signal depends on the second limit value.

8. The signal receiver of claim 7,
   wherein the second transistor is an N-channel transistor, and
   wherein the value of the second bias signal is substantially equal to the second limit value plus a gate threshold value of the second transistor.

9. The signal receiver of claim 2,
   wherein the first transistor is an N-channel transistor,
   wherein the value of the first bias signal is substantially equal to the second limit value plus a gate threshold value of the first transistor, and
   wherein the values of the clamped signal is less than or equal to the second limit value.

10. The signal receiver of claim 9,
    wherein the second transistor is a P-channel transistor,
    wherein a gate terminal of the second transistor receives a second bias signal, and
    wherein a value of the second bias signal depends on the first limit value.

11. The signal receiver of claim 10, wherein the value of the second bias signal is substantially equal to the first limit value minus a gate threshold value of the second transistor.

12. A signal receiver comprising:
    a limiter configured to receive an input signal, configured to generate a limited signal using the input signal, configured to limit values of the limited signal in a first range, and configured to output the limited signal, wherein the first range is defined by a first limit value and a second limit value, and wherein the first limit value is less than the second limit value; and
    an amplifier configured to receive the limited signal, configured to generate an output signal using the limited signal, and configured to output the output signal, wherein values of the output signal are in a second range, and wherein the second range is larger than or equal to the first range,
    wherein the amplifier comprises a first inverter and a second inverter,
    wherein the limiter comprises a P-channel transistor and an N-channel transistor, and
    wherein the P-channel transistor, the N-channel transistor, the first inverter, and the second inverter are electrically connected in a series connection.

13. A method of operating a signal receiver, the method comprising:
    generating a clamped signal using both a first transistor of the signal receiver and an input signal, wherein values of the clamped signal is greater than or equal to a first limit value or is less than or equal to a second limit value, and wherein the first limit value is less than the second limit value;
    generating a limited signal using both a second transistor of the signal receiver and the clamped signal, wherein the first transistor and the second transistor are electrically connected in a series connection, wherein values of the limited signal is in a first range, and wherein the first range is defined by the first limit value and the second limit value; and
    generating an output signal using both an amplifier of the signal receiver and the limited signal, wherein values of the output signal are in a second range, and wherein the second range is larger than or equal to the first range.

14. The method of claim 13, further comprising:
determining a value of a first bias signal using the first limit value or the second limit value; and
providing the first bias signal to a gate terminal of the first transistor.

15. The method of claim 14,
wherein the first transistor is a P-channel transistor,
wherein the value of the first bias signal is substantially equal to the first limit value minus a gate threshold value of the first transistor, and
wherein the values of the clamped signal are greater than or equal to the first limit value.

16. The method of claim 15, further comprising:
determining a value of a second bias signal using the second limit value; and
providing the second bias signal to a gate terminal of the second transistor.

17. The method of claim 16, further comprising:
providing a first body terminal signal to a body terminal of the first transistor; and
providing a second body terminal signal to a body terminal of the second transistor,
wherein a value of the first body terminal signal is greater than the second limit value,
wherein a value of the second body terminal signal is less than the first limit value, and
wherein the second range is defined by the value of the second body terminal signal and the value of the first body terminal signal.

18. The method of claim 14,
wherein the first transistor is an N-channel transistor,
wherein the value of the first bias signal is substantially equal to the second limit value plus a gate threshold value of the first transistor, and
wherein the values of the clamped signal is less than or equal to the second limit value.

19. An electronic device comprising:
an electronic component; and
a signal receiver electrically connected to the electronic component and comprising:
  a first transistor configured to generate a clamped signal using the input signal, wherein values of the clamped signal is greater than or equal to a first limit value or is less than or equal to a second limit value, and wherein the first limit value is less than the second limit value;
  a second transistor configured to generate the limited signal using the clamped signal, wherein the first transistor and the second transistor are electrically connected in a series connection, wherein values of the limited signal is in a first range, and wherein the first range is defined by the first limit value and the second limit value; and
  an amplifier configured to generate an output signal using the limited signal, wherein values of the output signal are in a second range, and wherein the second range is larger than or equal to the first range.

* * * * *